(12) United States Patent
Zhou

(10) Patent No.: US 7,151,415 B1
(45) Date of Patent: Dec. 19, 2006

(54) INJECTION LOCKED DUAL OPTO-ELECTRONIC OSCILLATOR

(75) Inventor: Weimin Zhou, Rockville, MD (US)

(73) Assignee: The United States of America as represented by the Secretary of the Army, Washington, DC (US)

(*) Notice: Subject to any disclaimer, the term of this patent is extended or adjusted under 35 U.S.C. 154(b) by 136 days.

(21) Appl. No.: 11/046,789

(22) Filed: Feb. 1, 2005

Related U.S. Application Data

(60) Provisional application No. 60/550,877, filed on Mar. 5, 2004.

(51) Int. Cl.
*H03B 1/04* (2006.01)
*H01S 3/098* (2006.01)
*G02F 1/39* (2006.01)

(52) U.S. Cl. .................. 331/66; 331/135; 359/329; 359/330; 372/18; 372/32

(58) Field of Classification Search ............ 331/65–66, 331/135–136; 359/328–330; 372/18, 32
See application file for complete search history.

(56) References Cited

U.S. PATENT DOCUMENTS

| | | | |
|---|---|---|---|
| 4,297,656 A * | 10/1981 | Pan | 331/135 |
| 4,613,828 A * | 9/1986 | Collette | 331/47 |
| 5,204,640 A | 4/1993 | Logan, Jr. | |
| 5,723,856 A | 3/1998 | Yao et al. | |
| 5,777,778 A | 7/1998 | Yao | |
| 6,594,061 B1 | 7/2003 | Huang et al. | |
| 6,946,989 B1 * | 9/2005 | Vavik | 342/51 |
| 7,061,335 B1 * | 6/2006 | Maleki et al. | 331/66 |
| 2005/0270222 A1 * | 12/2005 | Vavik | 342/51 |

* cited by examiner

*Primary Examiner*—John D. Lee
(74) *Attorney, Agent, or Firm*—William V. Adams

(57) ABSTRACT

An injection locked dual opto-electronic oscillator having a master oscillator which generates a high Q RF output signal with a plurality of harmonic signals within a predetermined pass band. A slave oscillator has a modulation input coupled to the output signal from the master oscillator as well as an output signal. The slave oscillator has a cavity length selected to produce a single mode operation within the pass band. An electronic phase shifter in the slave oscillator is adjustable to produce constructive interference at a single harmonic of the output signal from the master oscillator and destructive interference of all other harmonics within the pass band and to bring the slave oscillator into injection locked condition with the master oscillator. Therefore the slave OEO is used as a filter for the spurious radiation generated by the master OEO and at the same time preserves the high Q of the RF carrier signal from the master OEO.

10 Claims, 3 Drawing Sheets

INJECTION LOCKED DUAL OPTO-ELECTRONIC OSCILLATOR

RELATED APPLICATION

This application claims priority of U.S. Provisional Patent Application Ser. No. 60/550,887 filed Mar. 5, 2004, which is incorporated herein by reference.

GOVERNMENT INTEREST

The invention described herein may be manufactured, used, and licensed by or for the United States Government.

1. Field of the Invention

The present invention relates to opto-electronic oscillators.

2. Description of the Prior Art

Microwave radio frequency (RF) resonators or oscillators are used in numerous different applications including high frequency communication, navigation, timing, global position, radar detection and the like. The previously known microwave resonators have operated completely in the electronic domain. These previously known microwave electronic oscillators, however, all suffer from a number of common disadvantages.

One disadvantage of the RF electronic oscillators is that such RF oscillators operate with a relatively narrow bandwidth. As such, the amount of information that can be contained on modulated microwave frequencies is likewise necessarily limited.

A still further disadvantage of these previously known RF oscillators or modulators is that the electronic components used to construct the RF oscillators are relatively bulky, subject to EMI interference, and are also prone to high signal loss. Additionally, the quality factor or Q of the previously known electronic microwave resonators is typically in the range of 1,000–100,000. This relatively low Q factor of the currently known microwave RF oscillators results in a relatively low signal-to-phase noise ratio for the oscillator.

An opto-electronic oscillator (OEO) was previously invented to benefit the high Q by long optical fiber cavity. However this type of fiber OEO suffers from spurious radiation due to the supermodes introduced by the long cavity.

SUMMARY OF THE INVENTION

The present invention provides an injection locked dual opto-electronic microwave oscillator assembly which overcomes all of the previously known disadvantages of the previously known RF microwave oscillators.

In brief, the opto-electronic oscillator assembly of the present invention comprises a master opto-electronic oscillator having a laser which generates an optical output signal. The output signal from the laser is coupled as an input to an optical modulator having an RF input as well as an output.

The RF modulated optical output from the optical modulator is then coupled by an optical fiber to an optical input of a photodetector. The photodetector, upon receipt of the signal from the optical fiber, converts the optical signal into an RF signal. The RF signal is then filtered by bandpass filter so that the output signal from the bandpass filter is within a predetermined pass band. That signal is in turn amplified by an RF amplifier and a portion of the output signal from the amplifier is coupled as a feedback signal to the modulation input of the optical modulator.

The length of the optical fiber for the master oscillator is selected to produce a long cavity, high Q factor for the master oscillator, i.e. a Q factor in excess of $10^9$. Consequently, the output signal from the master oscillator includes not only the primary frequency, but also harmonics at evenly spaced intervals within the pass band of the filter. The frequency spacing of the harmonics is approximately equal to $$\frac{C}{nL}$$

where C equals the speed of light, n equals the index of refraction of the optical fiber, and L equals the length of the optical fiber.

A portion of the output signal from the master oscillator is then coupled as an inject lock input signal to a slave opto-electronic oscillator. The slave opto-electronic oscillator is substantially identical to the master electro oscillator with two exceptions. First, the length of the optical fiber within the slave oscillator is selected with a cavity length which permits only a single mode oscillation within the pass band. As such, the optical fiber used in the slave oscillator is much shorter than the length of the optical fiber in the master oscillator. Although this results in a relatively low Q for the slave oscillator, a high Q output signal from the slave oscillator is still maintained due to the injection locked high Q input signal received from the master oscillator.

Secondly, the slave oscillator includes an RF phase shifter in series with the RF signal within the slave oscillator. Adjustment of the phase of the RF signal by the phase shifter enables the RF signal from the master oscillator to injection lock the slave oscillator to achieve positive interference at a single harmonic within the pass band and, simultaneously, achieve negative interference at every other harmonic of the input signal received from the master oscillator. This, in turn, effectively cancels out all of the harmonics other than the single harmonic while simultaneously maintaining the high Q, high signal-to-phase noise value of the master oscillator.

In practice, the combination master and slave oscillators form an injection locked oscillator assembly in which the high Q signal from the master oscillator is injected into the slave oscillator and locks the oscillation frequency and phase of the slave oscillator. Since the cavity length of the optical fiber in the slave oscillator is selected such that only one oscillation mode is allowed within the RF pass band, the high Q of the master oscillator is maintained on the output from the slave oscillator and all unwanted harmonics are simultaneously eliminated.

BRIEF DESCRIPTION OF THE DRAWING

A better understanding of the present invention will be had upon reference to the following detailed description when read in conjunction with the accompanying drawing, wherein like reference characters refer to like parts throughout the several views, and in which.

DESCRIPTION OF A PREFERRED EMBODIMENT OF THE PRESENT INVENTION

Figure 1:
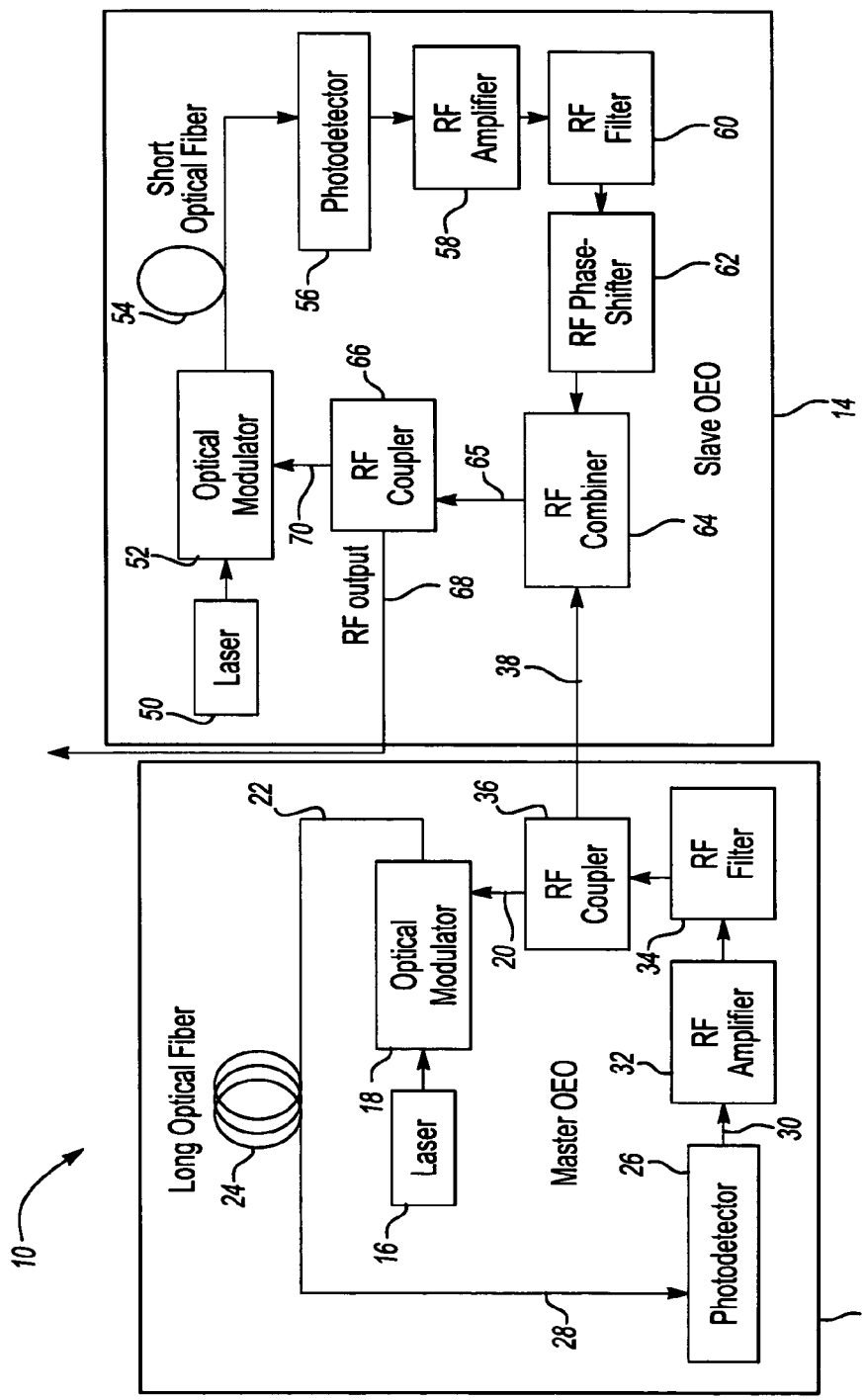
FIG. 1 is a schematic view illustrating a preferred embodiment of the present invention.

With reference first to FIG. 1, a preferred embodiment of the dual opto-electronic oscillator assembly 10 of the present invention is shown and includes both a master opto-electronic oscillator 12 as well as a slave opto-electronic oscillator 14. Both the master oscillator 12 and slave oscillator 14 will be separately described.

Still referring to FIG. 1, the master oscillator 12 includes a continuous wave laser 16 having its output connected as an input signal to an optical modulator 18. Any conventional laser 16 may be used and it will be understood that the output signal from the laser 16 may be either in the visible or invisible spectrum.

The optical modulator 18 includes both an RF microwave input 20 as well as an optical output 22. The optical modulator may be of any conventional construction, such as a Mach-Zehnder modulator or an electro-absorption modulator. Since the frequency of the laser 16 is much higher than the RF microwave modulation signal at the modulator input 20, the optical signal on the output 22 from the optical modulator 18 consists of an optical signal modulated at the frequency of the RF modulating signal. It is also possible to use a directly modulated laser instead of the laser 16 and modulator 18 to provide the optical output 22.

The output 22 from the optical modulator 18 is coupled by an optical fiber 24 to an optical input 28 of a photodetector 26. In the well-known fashion, the photodetector 26 converts the optical signal on its input 28 to an RF signal on its output 30.

The output 30 from the photodetector 26 is amplified by a microwave RF amplifier 32. The output from the RF amplifier 32 passes through an RF bandpass filter 34 to an RF coupler 36. The RF coupler 36 then electrically connects a portion of the RF signal from the filter 34 to the RF input 20 of the modulator 18. The RF signal applied to the modulator input 20 thus forms a feedback signal to cause the master oscillator 12 to oscillate at the desired microwave frequency, e.g. 10 gigahertz.

The optical fiber 24 serves as a long cavity optical delay to create a temporally shifted feedback signal to the optical modulator in order to achieve the oscillation. Furthermore, the length of the optical fiber 24 is selected to produce the necessary high Q for the master oscillator 12 in order to achieve the required signal-to-phase noise level. In practice, a length of several kilometers of the optical fiber 24 will produce Q values in excess of $10^9$ for the master oscillator 12.

In an optical oscillator, the mode spacing, i.e. the spacing between adjacent harmonic signals, is inversely proportional to the oscillator delay created by the optical fiber 24. The space in between the harmonic frequencies can be determined by the following formula:

$$\Delta f \approx \frac{C}{nL}$$

where $\Delta f$ equals the spacing between adjacent harmonic frequencies, C equals the speed of light, n equals the index of refraction of the optical fiber, and L equals the length of the optical fiber.

Consequently, assuming that the optical fiber has an index of refraction of approximately 1.46, as would be the case with Corning SMF28 optical fiber, and a length of 6 kilometers, the spacing between adjacent harmonics is about 34 kilohertz.

In practice, only a single mode or signal frequency of oscillation is desired from the master oscillator 12. However, the microwave RF filter 34 exhibits a pass band of 8 megahertz or greater and, as such, passes not only the desired center frequency but many harmonics at the frequency spacing $\Delta f$.

Figure 2:
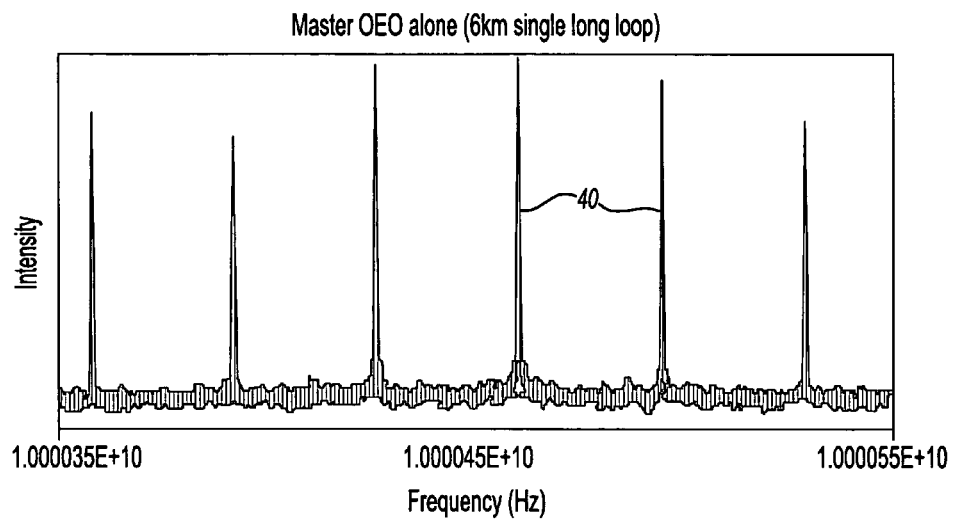
FIG. 2 is a frequency spectrum view of the output signal from the master oscillator.

With reference now to FIG. 2, an exemplary output signal on an output 38 from the RF coupler 36 is shown. The output from the RF coupler 36 includes a plurality of evenly spaced radio frequency peaks 40 each of which has a high Q shape and high signal-to-noise ratio. The peaks 40 are evenly spaced from each other by the frequency $\Delta f$.

With reference again to FIG. 1, the RF coupler 36 also provides an RF output signal on its output 38 to the slave oscillator 14. The slave oscillator 14 is also an opto-electronic oscillator and, as such, includes a continuous wave laser 50 which generates an optical input signal to an optical modulator 52. An output from the optical modulator 52 is optically coupled by an optical fiber 54 to an input of a photodetector 56.

The photodetector 56 converts the optical signal from the optical modulator to an RF signal which is then amplified by RF amplifier 58 and coupled as an input signal to an RF filter 60. The RF filter 60 has substantially the same pass band as the RF filter 34, e.g. 8 megahertz, and thus filters out all harmonics outside the pass band.

The output from the RF filter 60 is then coupled through an RF phase shifter 62 to an RF combiner 64 which combines the signal from the phase shifter 62 with the input signal from the master oscillator 12. This combined signal 65 is then fed to an RF coupler 66 which divides the combined RF signal from the RF combiner 64 into an RF output 68 from the opto-electronic oscillator as well as an RF input 70 of the optical modulator 52.

Unlike the master oscillator 12, the optical fiber 54 of the slave oscillator 14 is relatively short, i.e. about 50 meters for a 10 gigahertz oscillator, such that the Q of the slave oscillator 14 is very low. The length of the optical fiber 54, furthermore, is selected such that the slave oscillator 14 can only operate in a single oscillation mode within the pass band of the RF filter 60.

Figure 3:
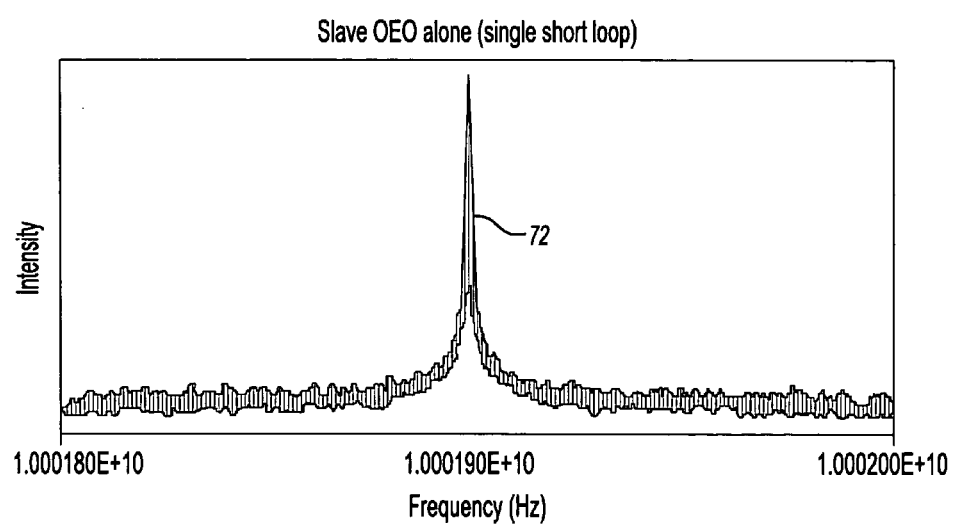
FIG. 3 is a frequency spectrum view of the output signal from the slave oscillator in free oscillation mode.

With reference now particularly to FIG. 3, a frequency spectrum output signal is illustrated of the slave oscillator 14 operating in a closed loop mode, i.e. in the absence of a signal from the master oscillator 12. As can be seen in FIG. 3, the output signal from the slave oscillator 14 provides a single peak 72 within the pass band of the RF filter 60. However, unlike the output from the master oscillator 12, the output signal from the slave oscillator 14 exhibits excessive noise due to the low Q of the slave oscillator 14.

Figure 4:
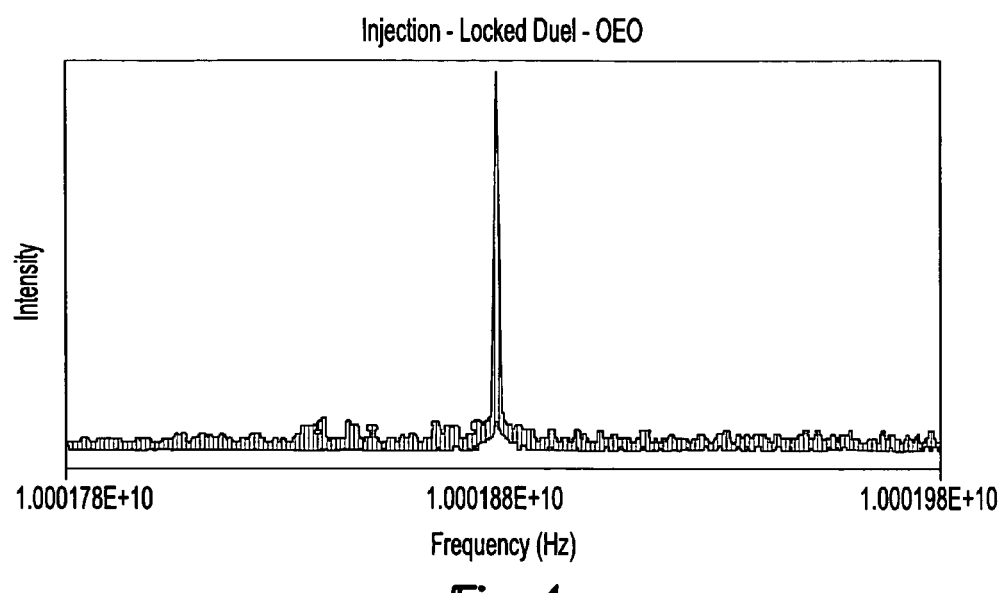
FIG. 4 is a frequency spectrum view of the output signal from the slave oscillation while injection locked by the master oscillator.

The multi-mode signals on the output 38 of the RF coupler 36 of the master oscillator 12, however, are injected into the RF combiner 64 of the slave oscillator. The phase shifter 62 is then adjusted, by any conventional means, e.g. electronically or manually, to bring the slave oscillator into the locking range of one of the strongest modes or peaks 40 of the master oscillator 12. When thus locked, the phase shifter 62 produces constructive interference at a single harmonic or oscillation mode of the output signal from the master oscillator 12 together with destructive interference of all other harmonics or modes within the pass band. This, in turn, produces a single mode high Q output signal on the output 68 from the slave oscillator 14 as illustrated in FIG. 4 since the high Q signal from the master oscillator 12 is maintained by the slave oscillator 14.

As can be seen from the foregoing, the present invention provides an opto-electronic oscillator assembly which, by using a master oscillator with a high Q value as an injection locking signal to an opto-electronic oscillator with a low Q, produces a single mode output signal with extremely high signal-to-phase noise ratio. Furthermore, the utilization of opto-electronics in the master oscillator enables the master oscillator to achieve an oscillator with Q values that are several magnitudes of order greater than Q values that can be obtained by previously known electronic oscillators alone which, in turn, produces the high signal-to-noise ratio in the output signal from the oscillator assembly.

Having described my invention, many modifications thereto will become apparent to those skilled in the art to which it pertains without deviation from the spirit of the invention as defined by the appended claims.

I claim:

1. An injection locked opto-electronic oscillator comprising:
    an opto-electronic master oscillator with a high Q cavity which generates an RF output signal with a plurality of harmonic signals within a predetermined pass band,
    an opto-electronic slave oscillator having an RF input coupled to said output signal from said master oscillator and an output RF signal, said slave oscillator having a cavity length selected to produce only a single mode operation within said pass band, and an electronic phase shifter adjustable to produce constructive interference at a single harmonic of said output signal from said master oscillator and destructive interference of all other harmonics within said pass band during an injection lock condition.

2. The invention as defined in claim 1 wherein said master oscillator comprises:
    a laser which generates an optical output signal,
    an optical modulator having an optical input which receives the optical output signal from the laser, an RF modulation input and a modulated optical output,
    a photodetector having an input and an output, said photodetector operable to convert an optical signal at its input to an RF output signal on its output,
    an optical fiber which optically couples said optical modulator output to said photodetector input,
    wherein a portion of said RF output signal is coupled as a feedback signal to said optical modulator's RF modulation input.

3. The invention as defined in claim 2 and comprising an RF filter connected in series with said photodetector output signal, said RF filter having a pass band less than or equal to said predetermined pass band.

4. The invention as defined in claim 3 and comprising an RF amplifier connected in series with said RF filter.

5. The invention as defined in claim 2 wherein said optical fiber has a length selected to produce a Q factor in excess of one million.

6. The invention as defined in claim 1 wherein said slave oscillator comprises:
    a laser which generates an optical output signal,
    a optical modulator having an optical input which receives the optical output signal from the laser, an RF modulation input and an optical output,
    a photodetector having an input and an output, said photodetector operable to convert an optical signal at its input to an RF output signal on its output,
    an optical fiber which optically couples said optical modulator optical output to said photodetector input,
    wherein a portion of said photodetector RF output signal is coupled to said optical modulator RF modulation input.

7. The invention as defined in claim 6 and comprising an RF filter connected in series with said photodetector output signal, said RF filter having a pass band less than or equal to said predetermined pass band.

8. The invention as defined in claim 7 and comprising an RF amplifier connected in series with said RF filter.

9. The invention as defined in claim 8 and comprising an adjustable RF phase shifter connected in series with said RF filter and said RF amplifier to facilitate the injection locking condition for the slave oscillator.

10. The invention as defined in claim 7 wherein the optical fiber has its length selected so that only one RF oscillation mode is allowed in the oscillator loop with the pass band of said RF filter.

* * * * *